Figure 1A:
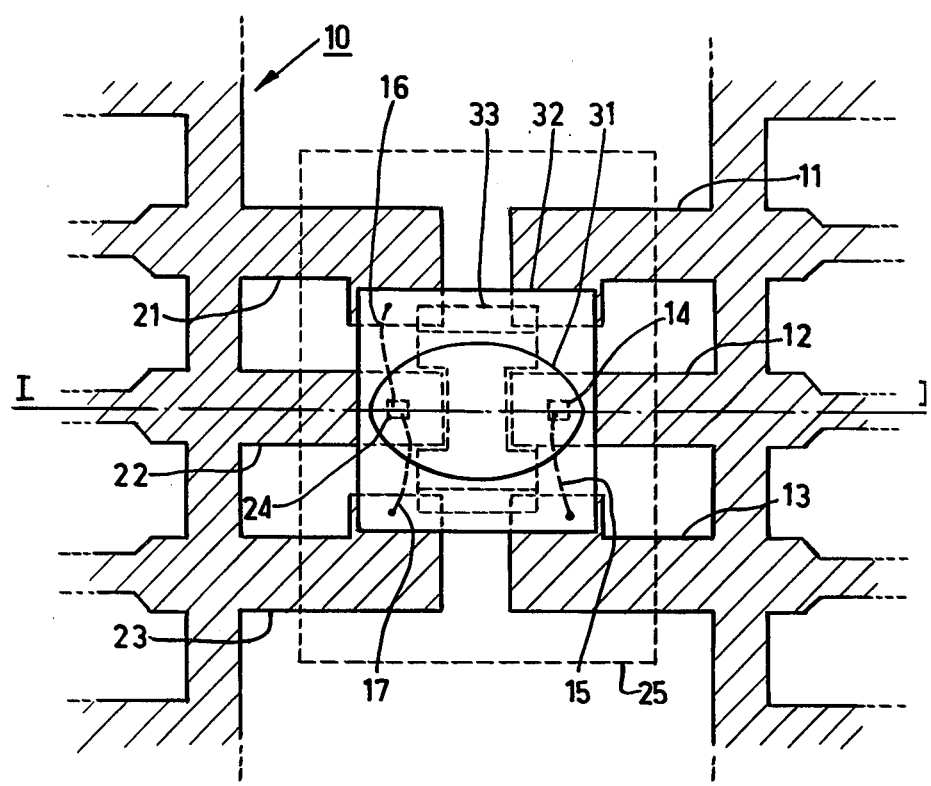

United States Patent [19]

Groff et al.

[11] 4,307,297
[45] Dec. 22, 1981

[54] OPTO-ELECTRONIC DEVICE

[75] Inventors: Alain Groff, Caen; André Talpied, Ifs par Caen, both of France

[73] Assignee: U.S. Philips Corporation, New York, N.Y.

[21] Appl. No.: 75,050

[22] Filed: Sep. 12, 1979

[30] Foreign Application Priority Data

Sep. 12, 1978 [FR] France .................. 78 26173

[51] Int. Cl.³ .............................................. G02B 27/00
[52] U.S. Cl. ........................................ 250/551; 357/19
[58] Field of Search .................. 250/551, 239, 216; 357/19

[56] References Cited

U.S. PATENT DOCUMENTS

| | | | |
|---|---|---|---|
| 3,628,039 | 12/1971 | Ochs et al. | 250/239 |
| 3,845,318 | 10/1974 | Thillays | 250/551 |
| 4,114,177 | 9/1978 | King | 357/19 |
| 4,124,860 | 11/1978 | Johnson | 250/551 |

*Primary Examiner*—David C. Nelms
*Attorney, Agent, or Firm*—Thomas A. Briody; William J. Streeter; Algy Tamoshunas

[57] ABSTRACT

A photocoupler is disclosed comprising a pair of coplanar elements spaced from each other so as to define an opening therebetween, a light emitter secured to one of the elements and a light receiver disposed opposite the light emitter and secured to the other element. The light from the light emitter is transmitted to the receiver by an optical element, such as a lens, having a central projection which extends into the opening between the two elements and accurately positions the optical element with respect to the light emitter and receiver for optimum light transmission therebetween.

6 Claims, 6 Drawing Figures

OPTO-ELECTRONIC DEVICE

The invention relates to an opto-electronic device comprising a semiconductor transmitter crystal which emits light and which bears on a first connection element, a semiconductor receiver crystal which receives the light emitted by the transmitter crystal and which bears on a second connection element, and an optical element which ensures the light transmission between the transmitter crystal and the receiver crystal. The crystals are substantially coplanar and placed opposite to the optical element, the crystals being connected electrically to other connection elements of the device.

Various types of opto-electronic devices are known comprising a light transmitter and a light receiver coupled optically to transfer an electric signal from a first circuit to a second circuit insulated entirely from the first by the action of a light beam. These devices, which are particularly referred to as photo-couplers, usually employ an electro-luminescent diode as a transmitter and a photodiode or a photo-transistor or a photoelectric resistor as a receiver, all of these elements being semiconductor elements.

Among the various types of photocouplers, those having the above-defined structure in which the transmitter crystal and the receiver crystal are substantially coplanar and provided opposite to the optical transmission element are particularly favourable. This is particularly due to their favourable performances at high frequencies as a result of the small capacitance between transmitter and receiver, the simplicity of the circuit, and the possibility of constructing such circuits according to known methods which are conventionally used for the manufacture of transistors and integrated circuits.

In one such construction of a photocoupler of the coplanar type, which is shown in the DE-AS 2,431,375, the support used is a perforated metal strip, usually termed grid. Connection lugs are formed in the strip which remain connected together mechanically and electrically during nearly the entire assembly and are held as such by strips forming transverse connections. The insulation operation, during which the connection lugs are insulated electrically, takes place at the end of the manufacturing cycle.

The crystals are connected to two coplanar connection lugs at a suitable distance from each other and are connected to lateral connection lugs by wires. A reflector is provided opposite to the crystals, the reflective surface of which has the shape of half an ellipsoid of revolution. The interior of the reflector is filled with a transparent resin to beyond the plane of the crystals. An envelope of an opaque synthetic resin surrounds the heart of the device, i.e. the crystals and the reflector, as well as the ends of the connection lugs near the crystals.

In photocouplers the value of the current transfer ratio is of great importance, that is to say the value of the ratio of the output current at the receiver end and the input current at the transmitter end. The greatest influence on the transfer ratio is due to the transfer losses of the light energy, that is to say losses as a result of the fact that not all the light rays from the active element of the transmitter converge on the active element of the receiver. These transfer losses in a coplanar photocoupler are particularly strongly dependent on the position of the optical element relative to the crystals. A small movement of the optical element is sufficient to cause the current-transfer ratio to decrease by a very considerable amount.

In the embodiment of a coplanar photocoupler according to the above-mentioned DE-AS 2,431,375, no mention is made of special provisions for the accurate positioning of the reflector relative to the crystals. Even if those elements were positioned correctly, movement during the subsequent process steps, especially during the thermosetting of the resins, could not be prevented. From this it follows that the current-transfer ratio of photocouplers thus manufactured in this manner differ considerably from device to device even if the elements thereof are identical.

It is the object of the present invention to provide photocouplers of the coplanar type in which the optical transmission element occupies a completely correct position and thus to avoid large disparities between the values of the current-transfer ratios in photo-couplers which in principle are identical.

Another object of the invention is to enable the automated provision of the optical transmission elements.

To this end, a photocoupler of the kind mentioned in the opening paragraph is characterised in that the optical element has a centring base, a part of which is positioned between the first and second connection elements.

The presence of a centering base which forms part of the optical element presents various advantages. First of all, it ensures that the optical element is adjusted perfectly with respect to the transmitter and receiver crystals because the centring base is provided between the two connection elements supporting the crystals.

Furthermore, this arrangement ensures that the optical element and the crystals in identical photocouplers occupy the same positions. It may, furthermore, be noted that the presence of a centring base enables a stable location of the optical element in an accurately, previously defined position which is not changed by subsequent manufacturing operations, especially the curing of the resins.

The centering base also expedites the manufacture of coplanar photocouplers. The use of automatic means is possible and checking afterwards may be omitted.

The above-mentioned advantages of the accurate positioning, stability, possibility of the use of automatic means which become possible by the presence of a centring base result in a higher average quality level of the manufactured photocouplers as compared with that of previous manufactures.

In a favourable embodiment of a coplanar photocoupler according to the invention, the part of the optical element which ensures the light transmission and the centring base are provided on either side of a flat supporting plate, the assembly forming a monolithic component manufactured from a transparent synthetic resin.

The supporting plate projects laterally beyond the two other parts of the optical element. Such an arrangement is advantageous because in one moulding operation a plurality of optical elements placed in lines and columns can be formed which are joined by their supporting plates. Separating the optical elements from such a system may be carried out in the same manner and with the same apparatus as the separation of semiconductor elements from a wafer in which a plurality of the semiconductor elements have been formed.

The centering base may, furthermore, be shaped so that it can be placed between the connection elements on which the transmitter and receiver crystals are connected and also in the intermediate space between said above-mentioned connection elements and the other elements forming part of the photocoupler. This arrangement eliminates substantially any movement of the optical element relative to the crystals in any direction parallel to the plane of the crystals omitted.

It is furthermore ensured that the centring base with parts of its structure bears on other connection elements of the photocoupler than the first and second elements. Above these first and second connection elements the centring base is provided with recesses so that the connection wires connecting the crystals electrically to the other connection elements remain free.

Figure 1B:
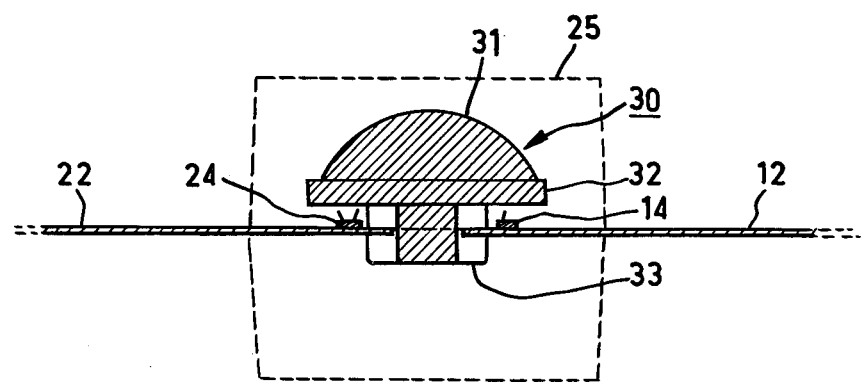
Figure 2A:
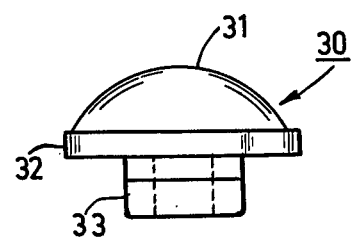
Figure 2B:
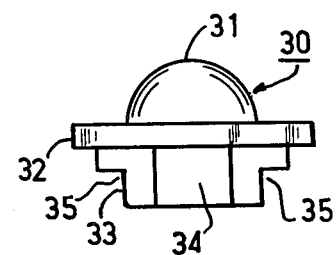
Figure 2C:
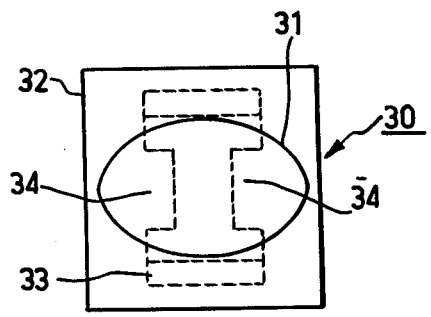
Figure 2D:
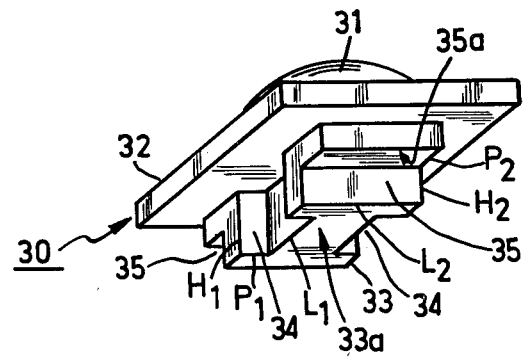

The invention will now be described in further detail, by way of example, with reference to the accompanying drawing, in which:

FIG. 1a is a plan view of a photocoupler according to the invention in a stage of its manufacture in which the optical element of the photocoupler is positioned, FIG. 1b is a sectional view taken on the line I—I of FIG. 1a, and FIGS. 2a to 2d show the optical element of FIGS. 1a and 1b. FIGS. 2a and 2b are elevations in two orthogonal directions; FIG. 2c is a plan view; FIG. 2d is a perspective underneath view.

The coplanar photocoupler shown in FIGS. 1a and 1b in a stage of manufacture near the final phase is manufactured on a metal lead frame or grid which has identical patterns of six connection elements distributed regularly over the length of the grid. Each pattern, e.g. the pattern 10 shown in FIG. 1a, is destined for the manufacture of a photocoupler. The grid may consist, for example, of ferro-nickel and may have been formed in known manner by punching or etching tape-shaped material.

The six connection elements of pattern 10 are arranged in two coplanar groups of three parallel elements situated at a regular distance from each other. The first group is formed by the lugs 11, 12, 13; the second group comprises the lugs 21, 22, 23. The lugs 11 and 21, 12 and 22, 13 and 23 are situated in the elongation of each other with their ends facing each other. The lugs 11, 21, 13 and 23, furthermore, are slightly wider at their free ends so that their distance with respect to the lugs 12 and 22 is reduced and the electric connection by wires to the crystals of the photocoupler is facilitated.

The photocoupler manufactured on said grid has a light transmitter 14 consisting of a semiconductor crystal, e.g. an electroluminescent diode, which is secured to the lug 12 by conventional means such as by soldering or gluing. The grid, furthermore, comprises a light receiver 24 consisting of a semiconductor crystal, e.g. a photo-transistor, which is secured to the lug 22 by soldering or gluing. The diode 14 is connected to the lug 13 by means of the connection wire 15. The photo-transistor 24 is connected at one end to the lug 21 by the connection wire 16 and at the other end to the lug 23 by the connection wire 17.

The light transmission between the crystals 14 and 24 is ensured by an optical element 30, the active part 31 of which is situated above the crystals. The optical element 30 has a centring base 33 (see FIGS. 1 and 2) a part of which is positioned between the first and second connection elements 12 and 22.

In a favourable embodiment of the optical element 30 shown in particular in FIG. 2, three parts are to be distinguished in the optical element: a first part or lens 31 has substantially the shape of half an ellipsoid. This first part projects above a flat second part or flange 32 which has a uniform thickness and which will hereinafter be referred to as a supporting surface. The supporting surface 32 continues in a third part 33 which centers the photocoupler. The assembly is rigid, has a unitary construction and is made, for example, from a transparent resin having a high refractive index.

The centering base 33 of the optical element 30 has substantially the shape of a parallelepiped the side faces of which are parallel to the axes of the lens 30. Two pairs of recesses are provided in it, its side faces. The first pair of symmetrical recesses 34 has a length $L_1$ (see FIG. 2d) measured parallel to the small axis of the lens 31 which is slightly larger than the width of the lugs 12 and 22. The depth $P_1$ of the recesses 34 is chosen to be such that the thickness of the part of the base 33 situated between the recesses 34 is slightly smaller than the distance between the free ends of the lugs 12 and 22. The height of the base 33 is denoted by $H_1$.

The second pair of symmetrical recesses 35 has a length $L_2$ measured parallel to the large axis of the lens 31. The depth $P_2$ is chosen to be such that the thickness of the base 33 between said recesses is slightly smaller than the distance between the widened parts of either the lugs 11 and 13, or the lugs 21 and 23. The height $H_2$ of the recesses 35, taken from the plane 33a of the base 33, is smaller than the height $H_1$ of the base, which causes a difference in height between the faces 35a and 33a.

The optical element 30 is adjusted, by means of base 33, whose shape has been described above, with no observable play with respect to the crystals 14 and 24 (see FIGS. 1a and 1b). It bears with the faces 35a of the recesses 35 on the lugs 11 and 21, on the one hand, and 13 and 23, on the other hand. The part of the base 33 having a height $H_1$ is positioned between the lugs 12 and 22 (part of the base situated between the recesses 34) and furthermore in the intermediate spaces between the connections 11 and 12, 21 and 22, 12 and 13, 22 and 23. In this manner the optical element 30 is secured in an unambiguously defined position and cannot move in any direction parallel to the planes of the lugs and the crystals.

The crystals 14 and 24 are situated on the input side of the recesses 34 which extend in the direction of height above said crystals. In this manner there is no risk of the connection wires 15, 16 and 17 being touched during provision of the optical element 30.

It will be understood that the presence of a centering base which is connected to the optical element of a coplanar photocoupler facilitates the manufacture of such a device, because the centring base makes the centring of the optical element extremely simple. The supporting plate 32 which extends beyond the centring base 33 provides an extra advantage during the manufacture of the optical elements in that it facilitates the manufacture by automated processes. By using supporting plates 32 it is in fact possible to unite several hundred optical elements in plates in which the optical elements are arranged regularly according to lines and columns in a selected orientation. A plate and the optical elements thereof constitute one assembly which is obtained directly by moulding. Before use, the optical elements are severed. For that purpose, longitudinal and transvere grooves are provided between the elements bounding square or rectangular contours of the supporting plates, e.g. the supporting plate 32, and enabling the complete severing of the optical elements at the instant of their use. The operations of providing the grooves, the complete severing, the removal of the optical elements for providing and the provision itself can be carried out in the same manner as that of semiconductor devices manufactured on the same plate of silicon and with the same material so that the possibility of mechanisation at reduced costs is available.

It will be obvious that the embodidment of the invention shown in FIGS. 1 and 2 does not constitute any limitation of the invention. Especially the structure of the pattern 10, the shapes, dimensions and mutual distances of the connection elements, the shape of the lens 31 which may be coated with a reflective layer, that of the centering base 33 may be varied and in spite of detail changes enable the use of the invention.

After providing the constituents of the photocoupler, a drop of transparent resin is provided between the supporting plate 32 and the crystals 14 and 24 so as to obtain an optical connection between the crystals and the lens 31. After the drop of resin has solidified, the device is enveloped in a rigid block of opaque resin. The contour of the block is shown by broken lines and is referenced 25 in FIGS. 1a and 1b. The parts of the lugs 11, 12 and 13, 21, 22 and 23 disposed beyond the block and separated from each other are finally curved to the desired shape.

what is claimed is:

1. An opto-electronic device comprising a first planar element, a second planar element coplanar with and spaced from said first element so as to define an opening therebetween, a semiconductor light emitting device secured to one of said first and second elements, a semiconductor light receiving device disposed opposite said light emitting device and secured to the other of said first and second elements, an optical element for transmitting light emitted by said emitting device to said receiving device, said optical element being positioned opposite said emitting and receiving devices and having a central projection of a configuration corresponding to that of said opening and extending into said opening so as to position said optical element with respect to said emitting and receiving devices for optimum transmission of light therebetween, and at least one electrical connector connected to each of said emitting and receiving devices.

2. An opto-electronic device according to claim 1 wherein said connectors are flat strips coplanar with said first and second elements, each of said connectors being disposed adjacent a respective one of said first and second elements so as to define therewith said opening for said projection of a configuration which prevents movement of said optical element relative to said semiconductor devices in any direction parallel to the plane of said first and second elements upon insertion of said projection of said corresponding configuration into said opening.

3. An opto-electronic device according to claim 2 including a pair of said flat connectors connected to each of said semiconductor devices, the connectors of each pair being disposed on opposite sides of a respective one of said first and second elements.

4. An opto-electronic device according to claim 2 wherein said projection has a shoulder which engages the surface of at least one of said connectors.

5. An opto-electronic device according to claims 1 or 2 wherein said optical element is of unitary construction and has an ellipsoidal portion for transmission of light from said emitting device to said receiving device, a flat surface facing said emitting and receiving devices, said projection extending from said flat surface towards and through said opening, and an outwardly extending flange between said ellipsoidal portion and said projection.

6. A method of making an opto-electronic device comprising the steps of:

providing a planar, metal grid having a plurality of patterns each comprising at least a first and second pair of elongated, adjacent strips, said strips of each pair being coplanar and generally aligned with the strips of the other pair and each strip having a free end, said strips being arranged so that the free end of each strip of one pair is disposed opposite to and spaced from the free end of an associated one of the strips of the other pair to define an opening therebetween, securing a light transmitting device to one of said strips of said first pair of each pattern, securing a light receiving device to an oppositely disposed strip of said second pair of each pattern so that said receiving device is disposed opposite to said emitting device, placing an optical element for transmitting light from said emitting device to said receiving device opposite said emitting and receiving devices by inserting a projection extending from said optical element into said opening, said projection and opening being configured so that upon insertion of said projection into said opening said optical element is positioned relative to said emitting and receiving devices for optimum transmission of light therebetween, electrically connecting said emitting device to the other strip of said first pair, electrically connecting the receiving device to the other strip of said second pair to thereby form, on each pattern, an assembly comprised of said strips, emitting and receiving devices and said optical element, and separating said assemblies from said grid.

* * * * *